(12) United States Patent
Jangiti et al.

(10) Patent No.: US 8,815,196 B2
(45) Date of Patent: Aug. 26, 2014

(54) METHOD FOR IN-DUCT UREA INJECTION FOR SELECTIVE CATALYTIC REDUCTION ON SMALL BOILERS AND COMBUSTION SOURCES

(71) Applicants: Saiprasad Jangiti, Woodbury, CT (US); Thomas V. Eldredge, Monroe, CT (US); Jeffrey Michael Broderick, Ridgefield, CT (US); James M. Valentine, Fairfield, CT (US)

(72) Inventors: Saiprasad Jangiti, Woodbury, CT (US); Thomas V. Eldredge, Monroe, CT (US); Jeffrey Michael Broderick, Ridgefield, CT (US); James M. Valentine, Fairfield, CT (US)

(73) Assignee: Peerless Mfg. Co., Dallas, TX (US)

( * ) Notice: Subject to any disclaimer, the term of this patent is extended or adjusted under 35 U.S.C. 154(b) by 0 days.

(21) Appl. No.: 14/046,429

(22) Filed: Oct. 4, 2013

(65) Prior Publication Data
US 2014/0099247 A1    Apr. 10, 2014

Related U.S. Application Data

(60) Provisional application No. 61/710,097, filed on Oct. 5, 2012.

(51) Int. Cl.
*B01D 53/56* (2006.01)
*G05D 7/00* (2006.01)
*G06F 17/50* (2006.01)

(52) U.S. Cl.
CPC .......... *B01D 53/565* (2013.01); *G06F 17/5009* (2013.01)
USPC ......... 423/239.1; 422/105; 422/108; 422/111

(58) Field of Classification Search
USPC ........................ 423/239.1; 422/105, 108, 111
See application file for complete search history.

(56) References Cited

U.S. PATENT DOCUMENTS

| | | | |
|---|---|---|---|
| 3,900,554 A | | 8/1975 | Lyon |
| 4,636,370 A | * | 1/1987 | Dean et al. .................... 423/235 |
| 4,842,834 A | | 6/1989 | Burton |
| 5,342,592 A | | 8/1994 | Peter-Hoblyn et al. |
| 7,090,810 B2 | | 8/2006 | Sun et al. |
| 7,467,749 B2 | | 12/2008 | Tarabulski et al. |
| 7,829,033 B2 | | 11/2010 | Sun et al. |
| 2004/0057888 A1 | | 3/2004 | Buzanowski |

OTHER PUBLICATIONS

U.S. Appl. No. 61/710,356, Broderick et al. filed Oct. 5, 2012; 10 pages.

* cited by examiner

*Primary Examiner* — Timothy Vanoy
(74) *Attorney, Agent, or Firm* — St. Onge Steward Johnston & Reens LLC

(57) ABSTRACT

A method for reducing NOx emissions from a lean burn combustor equipped with a NOx reducing exhaust catalyst, includes at least the following steps: (i) generating a computer based model of the geometry of an exhaust system of the combustor; (ii) computing at least one of flue gas velocity profiles and mass flow stream lines for exhaust gas flow through the exhaust system; (iii) inputting injector data comprising at least droplet size and velocity; (iv) modeling droplet trajectories for a plurality of injector locations; (v) modeling at least one flow conditioning device in the exhaust system; and (vi) manipulating the computer based model until an injector location is identified that provides a predicted root mean square (RMS) of reagent at the face of the catalyst that is less than 15%.

22 Claims, 1 Drawing Sheet

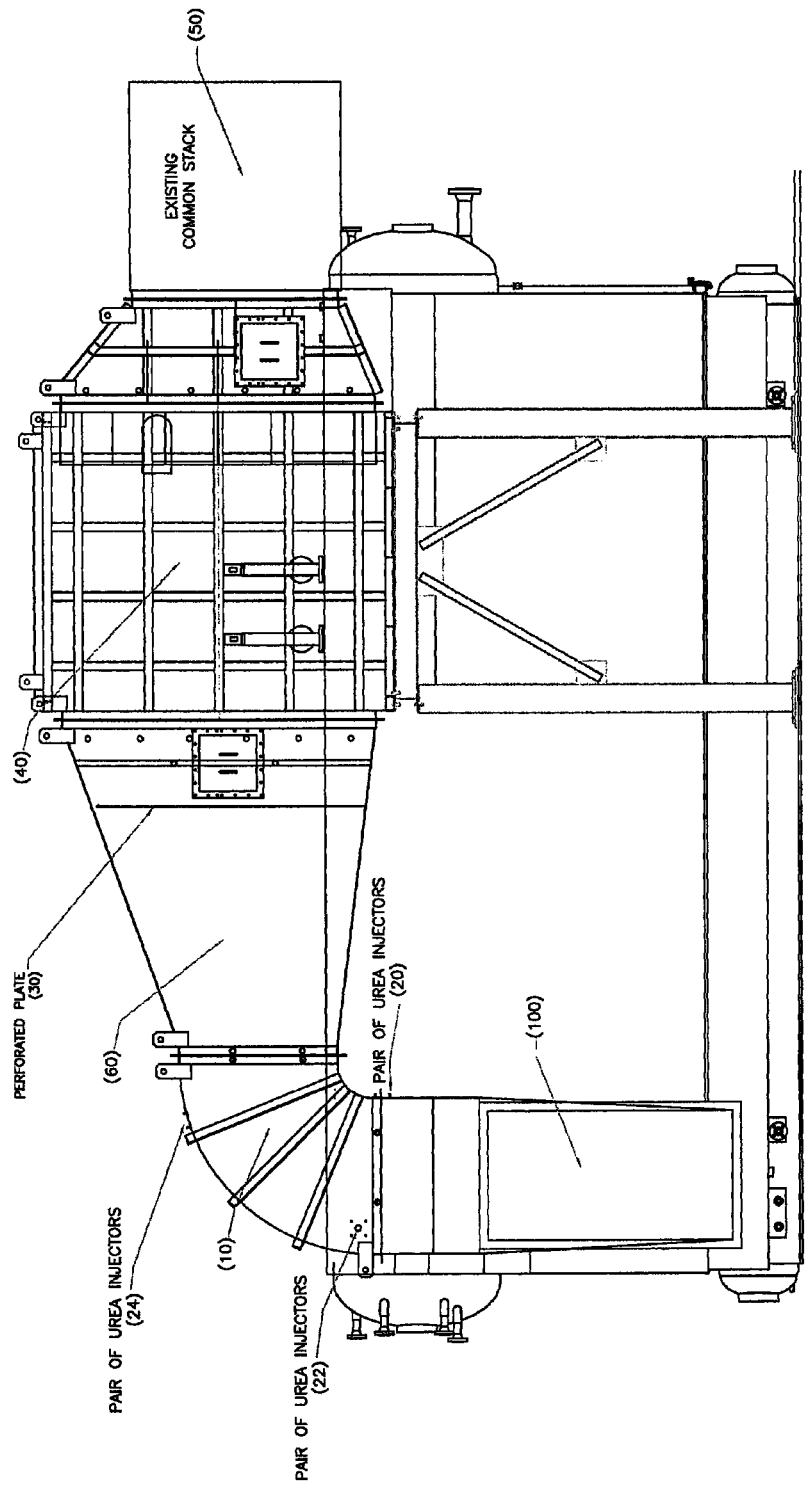

METHOD FOR IN-DUCT UREA INJECTION FOR SELECTIVE CATALYTIC REDUCTION ON SMALL BOILERS AND COMBUSTION SOURCES

CROSS-REFERENCE TO RELATED APPLICATIONS

The present application claims the benefit under 35 U.S.C. §119(e) of the U.S. Provisional Patent Application Ser. No. 61/710,097, filed on Oct. 5, 2012.

FIELD OF THE INVENTION

The present invention relates generally to a method for reducing nitrogen oxide ("NOx") emissions from a lean burn combustor equipped with a NOx reducing exhaust catalyst, and more specifically to a such a method involving the selection of those reagent injector locations and flow conditioning devices useful in achieving desired NOx reduction results.

BACKGROUND OF THE INVENTION

The art for the reduction of NOx from lean burn combustion sources has found the injection of ammonia or urea into exhaust ducts and flues upstream of a selective catalytic reduction (SCR) catalyst to be a solution to the issue of NOx emissions from diesel engines, gas turbines, boilers and the like. Urea, while a preferred reagent for SCR due to its safety and handling characteristics compared to ammonia, generally requires complicated and costly urea decomposition schemes directed at converting the aqueous urea reagent into ammonia gas prior to injection of ammonia gas into the exhaust through a series of ammonia distribution pipes or an ammonia injection grid (AIG). The AIG is located upstream of the SCR catalyst and positioned horizontally or vertically across the inside of an exhaust gas duct.

The direct injection of aqueous urea through a grid has generally not been practical due to the formation of deposits in the grid from the incomplete decomposition of urea in the grid. This has led to efforts to inject urea at the wall of the duct, which while successful on small SCR applications, such as passenger car diesel exhausts and even larger stationary engines, has not generally been applied to the larger duct sizes and gas flows found on industrial boilers, furnaces and combustion turbines. That is generally due to: the inability to achieve sufficient penetration and distribution of urea reagent injected from the wall into the full exhaust gas flow; the inability to complete the process of urea decomposition to ammonia in the exhaust gas before the SCR catalyst; and, the inability to establish uniform distribution of ammonia at the SCR catalyst face, especially with short residence times or in large cross sectional ducts, or in ducts with complex physical arrangements, such as turns and bends.

The prior art discloses the wall injection of aqueous urea and ammonia reagents on large boilers using the selective non-catalytic reduction process (SNCR). In the case of SNCR, the reagent is generally mixed with dilution water and injected as a very dilute solution with high volumes of liquid in the high temperature zone of the furnace at temperatures of 1700° F. to 2100° F. The dilution water ensures penetration of the reagent across the large furnace dimensions while the hot flue gas evaporates the water and allows the reagent to decompose and react with NOx in a non-catalytic process.

For example, in U.S. Pat. No. 3,900,554, Lyon discloses the injection of an aqueous solution of ammonia into a furnace at a true temperature of 1300° F. to 2000° F. for the selective non-catalytic reduction of NOx. In U.S. Pat. No. 4,842,834, Burton describes a process for injecting reagents, including urea, into large furnaces at a temperature of 1700° F. to 2500° F. using an atomization conduit positioned on the furnace wall. Peter-Hoblyn et al., in U.S. Pat. No. 5,342,592, describe the use of retractable and water-cooled injectors for the injection of reagent across large furnace dimensions with high flue gas temperatures.

In contrast, the current invention is directed at the injection of relatively low volumes of concentrated reagent for small boilers or gas fired combustion systems using SCR. The low volume of reagent makes penetration of the reagent in the gas stream difficult when injected from the wall and the low exhaust gas temperatures of typically 400° F. to 950° F. and the shorter residence time makes conversion of the liquid reagent to ammonia gas difficult when injected directly into the low temperature exhaust gas stream. For these smaller low temperature combustors, the art has typically relied on complex and costly urea to ammonia conversion processes for converting aqueous solutions of urea or ammonia to a gas for injection through an injection grid disposed in the primary exhaust stream upstream of the SCR catalyst.

In U.S. Pat. Nos. 7,090,810 and 7,829,033 to Sun et al., complex and costly systems are described for the conversion of aqueous urea solution to ammonia in a bypass duct for injection through an AIG upstream of a catalyst. In application U.S. Patent Application Publication No. 2004/0057888 A1, now abandoned, Buzanowski describes the art and method for using injection lances for injection of gaseous reagents through an AIG.

In co-pending Provisional Patent Application No. 61/710,356, Broderick et al. discuss a method for converting urea to ammonia for small boilers with injection through an AIG upstream of a catalyst. However, even the simplified system of Broderick et al. requires additional hot gas ductwork, a fan, a supplemental heating source and an AIG to introduce gasified urea into the primary exhaust gas stream.

The art has been seeking a method where simplified wall injection techniques and lower cost hardware can be used to directly inject aqueous based reagents into the exhaust duct of a combustor upstream of a catalyst such that the reagent is decomposed to ammonia gas and evenly distributed across the face of the downstream catalyst. The present invention employs a method and approach for selecting the preferred injector locations and flow conditioning devices useful in achieving the objective of good distribution of reagent injected from the wall across the catalyst face.

One method of measuring the precision of injection and mixing, and the uniformity of ammonia distribution at the catalyst face, is noted in the art as the root mean square (RMS) deviation of the distribution of ammonia at the catalyst face where an RMS of 0% is perfect distribution and a target of less than 10% RMS is desirable.

Contrary to conventional trial and error field methods of moving injectors from location to location and then measuring emissions to identify the preferred injector location, or costly construction of a scaled physical flow model of an exhaust to simulate injector locations, the current invention provides an improved method to predict and select those reagent injector locations and flow conditioning devices useful in achieving an RMS of ammonia distribution at the catalyst face of <15% over the operating range of the combustor and preferably <10%. Field data confirm the validity of the predicted performance and the selection of injector locations.

SUMMARY OF THE INVENTION

In accordance with one aspect of the present invention, a method for reducing NOx emissions from a lean burn combustor equipped with a NOx reducing exhaust catalyst includes the steps of: (i) constructing a computer based model of the geometry of an exhaust system of the combustor with an inlet and an outlet using computational fluid dynamics modeling techniques; (ii) computing flue gas velocity profiles and mass flow stream lines for exhaust gas flow through the exhaust system; (iii) inputting spray lab data for known injection spray parameters, including at least droplet size and velocity; (iv) modeling droplet trajectories for selected injector locations; (v) inputting at least one flow conditioning device inserted in the exhaust system into the computer based model; (vi) integrating the computer based model until an injector location is identified that provides a predicted root mean square (RMS) of reagent at a face of the catalyst that is less than 15%; (vii) installing at least one reagent injector on the exhaust system in a location identified in said integrating step; and (viii) injecting an aqueous based reagent so that NOx is reduced across a downstream catalyst installed in the exhaust system of the combustor.

In some embodiments, the predicted root mean square (RMS) at the catalyst face is less than 10% at a load condition on the combustor of 80% to 100% of the full load combustor capacity. In some embodiments, the injector is a solenoid pulse width reagent injector used without air assistance. In other embodiments, the injector is used with air assistance for atomization to produce a droplet of less than 50 microns Sauter mean diameter.

In some embodiments, the reagent is urea. In other embodiments, the reagent is ammonia. In some embodiments, the uncontrolled NOx emissions of the combustor are less than 100 ppm. In some embodiments, the injection rate of the at least one reagent injector is less than 60 gph.

In some embodiments, the flow conditioning device comprises at least one of the following: a perforated plate, a turning vane, a baffle, and a swirler. In certain of these embodiments, the flow conditioning device is located in the exhaust system upstream of a first injection point of the reagent. In other of these embodiments, the flow conditioning device is located in the exhaust system downstream of a first injection point of the reagent but upstream of the face of the catalyst.

BRIEF DESCRIPTION OF THE DRAWING

FIG. 1 is a schematic cross-sectional view of an exhaust stack with various components thereof having been positioned using the method of the present invention.

DETAILED DESCRIPTION OF THE INVENTION

A detailed description of a particular exemplary embodiment of the present invention is provided below in conjunction with a practical example.

Practical Example:

The exhausts from two 50,000 lb/hr natural gas fired water tube boilers were merged into a common exhaust duct measuring 4.5'×6' and leading to a common exhaust stack. The combined exhaust flow with both boilers operating at full load is approximately 121,000 lb/hr at a flue gas temperature of 550° F. An SCR catalyst was installed in an expanded section of the common duct with the objective of reducing NOx emissions from 30 ppm to less than 5 ppm throughout the normal boiler operating range. Due to safety considerations at the site, the preferred reagent was an aqueous based urea solution.

The selection of the location for injection and distribution of small quantities of an aqueous solution of urea reagent into the common exhaust duct was complicated by the imbalances in exhaust gas flow as the two exhausts merged and passed through a ninety degree bend; and also due to the small quantity of reagent relative to the bulk gas flow. A targeted NOx emission level of less than 10 ppm (at 3% O2) and preferably less than 5 ppm from an uncontrolled level of 30 ppm required good penetration and distribution of the urea at the point of injection, decomposition of the urea in the duct before the SCR catalyst and good distribution of ammonia across the face of the catalyst (an RMS<10%). Otherwise the NOx reduction required would not be achieved and ammonia that did not react with NOx across the catalyst could exit the catalyst as ammonia slip. The ability to apply flow conditioning devices to provide uniform gas velocity and ammonia distribution at the face of the catalyst was complicated by an overall backpressure limitation of 0.5" water column imposed by the existing boiler fan capacity.

Description of the Inventive Solution

Computational Fluid Dynamics Modeling (CFD) and solid modeling techniques were used to construct a model of the exhaust duct and SCR reactor geometry. A simplified flow model was constructed to predict gas flow behavior in the duct work to determine the extent of imbalances prior to the SCR catalyst face. The model results clearly indicated non-uniform gas flow and poor axial velocity and ammonia distribution at the catalyst face. To mitigate the imbalances, additional CFD models were run which included flow conditioning devices such as baffles and variations of perforated plates.

Injector locations were selected in an effort to match the reagent flow distribution with the exhaust gas flow distribution in such a way as to produce an acceptable RMS distribution of ammonia on the SCR inlet face. The methodology included identifying high mass flow stream tubes of exhaust gas and locating injectors so as to target the reagent injection into the high mass flow exhaust gas stream tubes as predicted by the model. Boundary condition data generated in a spray laboratory for an injector's spray characteristics, including velocity and droplet size, were used as inputs to the model.

Efforts to find injector locations across a plane in the duct which achieved a reasonable mixing of injected reagent in the duct before the catalyst proved unable to establish an RMS for ammonia at the catalyst face of less than an 18% RMS. This would not achieve the NOx reductions and low ammonia slip required for the units. This poor distribution remained after several versions of flow straightening baffles and turning vanes were simulated in the model.

After several iterations, a perforated plate with 60% open area was identified through the model simulations as providing the needed flow conditioning after the point of injection and prior to the catalyst to achieve the targeted reagent distribution at the catalyst face with less than a 10% RMS.

The inventive method of the present invention then involved the following steps:

1. Building a computer model of the duct geometry from the boiler outlets to the catalyst reactor outlet using solid modeling and unstructured/structured meshing techniques.

2. Computing the flue gas velocity profiles and gas flow stream lines through the duct and at the catalyst face using commercially available CFD software, such as ANSYS Fluent® and STAR CCM+.

3. Inputting into the CFD model boundary condition data generated from phase Doppler particle analyzer (PDPA) laboratory test results for the injector regarding droplet size, volume flux distribution, spray angle and droplet velocity at a known reagent pressure to the injector.

4. Determining droplet trajectories from different injector locations to the catalyst face.

5. Inputting flow conditioning devices, such as turning vanes, perforated plates and baffles, into the model to determine the impact on gas flow distribution at the catalyst face and on system backpressure.

6. Selecting a perforated plate with a sufficiently high percentage of open area (e.g., >60%) to help balance gas flow and maintain the back pressure increase to less than 0.5" water column and locating the perforated plate in the duct upstream of the SCR catalyst.

7. Locating each of a plurality (e.g., six) injectors on the walls of the duct upstream of the perforated plate and SCR catalyst to target specific gas stream tubes. The stream tubes, which are targeted, carry most of the gas flow. Injected reagent is targeted and mixes in each stream tube as the gas flows towards the catalyst face. Based on the targeted injection into the stream tubes and the mixing of the reagent within each stream tube, the resulting RMS for the ammonia distribution at the catalyst face is predicted to be less than 10% at full load on the boilers.

8. Utilizing solenoid actuated return flow injectors with known PDPA spray results and variable on time, such that the urea injection rate from each injector can be precisely controlled by a programmable logic control (PLC) based controller. The PLC controller matches injection rate at each injector location to changes in gas flow resulting from changes in boiler operating loads and gas flow conditions.

9. Programming the PLC based controller such that the urea injection rate from each injector automatically changes as a function of boiler load, fuel feed rate or outlet NOx as measured by a NOx sensor or outlet ammonia slip as measured by a sensor to maintain an RMS of ammonia at the catalyst face of <15% over the operating range of the boiler when a temperature permissive at the catalyst allows reagent injection.

Results

FIG. 1 shows the injector locations (20,22,24) for the pairs of injectors predicted by the model and as installed on the physical exhaust duct (10), as well as the 60% perforated plate location (30) relative to the injectors, the SCR catalyst (40) and the existing exhaust stack (50).

For the pair of 50,000 lb/hr boilers described in the Example above the model results indicated that two injectors (20) should be located low on the inside of the duct wall at the inlet to the vertical duct bend after the boiler exhausts (100) merged, two injectors (22) should be located opposite each other on the side walls at the bottom front third of the vertical duct bend, and two injectors (24) should be located on the top side of the duct bend at the outlet of the bend before the transition duct (60) to the SCR catalyst.

In the Example described above the uncontrolled NOx emissions were measured in the field at 25 ppm in the exhaust gas using a hand held meter when both boilers were operated simultaneously at 65% load. Two separate dosing and control systems (specifically, TRIM-NOX® LT dosing and control systems as manufactured by Combustion Components Associates), were used to supply reagent to a total of six injectors, three of which were associated with each boiler. Three injectors were controlled by one injection controller and positioned on one side of the exhaust duct opposite the other three injectors. At an injection rate of 1.07 gph of a 40% aqueous urea solution the NOx emissions were reduced to 2 ppm after the catalyst with no ammonia slip detected.

At a 40% load condition on each boiler the baseline NOx was reduced from 20 ppm down to 2 ppm at a total injection rate of 0.72 gph with ammonia slip detected at below 1 ppm.

All six injectors were of the solenoid actuated single fluid return flow type injector described in U.S. Pat. No. 7,467,749 to Tarabulski et al. and produced droplets with 65 micron Sauter mean diameter at supply pressures of 60-100 psi and a normal operating pressure of 80 psi. The location of each pair of reagent injectors was matched to the specific high mass flow rates of the exhaust gas as predicted by the model, with the injectors installed at accessible points in the duct upstream of the catalyst.

A urea pumping skid with a programmable logic controller (PLC) was used to monitor boiler fuel feed rate and to adjust the on time signal sent to each injector to control the rate of urea injection as a function of boiler load. A temperature sensor at the catalyst was tied into the PLC as a permissive to allow the start of injection when the exhaust gas temperature at the catalyst reached 370° F. and preferably above 400° F. A low temperature vanadium based SCR catalyst was installed in a reactor downstream of the injector locations to react ammonia and NOx in the flue gas to elemental nitrogen. Other known catalyst formulations can also be used.

Although the invention has been described with reference to a particular arrangement of parts, features and the like, these are not intended to exhaust all possible arrangements or features, and indeed many modifications and variations will be ascertainable to those of skill in the art.

What is claimed is:

1. A method for reducing NOx emissions from a lean burn combustor equipped with a NOx reducing exhaust catalyst, said method comprising the steps of:
   constructing a computer based model of the geometry of an exhaust system of the combustor with an inlet and an outlet using computational fluid dynamics modeling techniques;
   computing flue gas velocity profiles and mass flow stream lines for exhaust gas flow through the exhaust system;
   inputting spray lab data for known injection spray parameters, including at least droplet size and velocity;
   modeling droplet trajectories for selected injector locations;
   inputting at least one flow conditioning device inserted in the exhaust system into the computer based model;
   integrating the computer based model until an injector location is identified that provides a predicted root mean square (RMS) of reagent at a face of the catalyst that is less than 15%;
   installing at least one reagent injector on the exhaust system in a location identified in said integrating step; and
   injecting an aqueous based reagent so that NOx is reduced across a downstream catalyst installed in the exhaust system of the combustor.

2. The method of claim 1, wherein the predicted root mean square (RMS) at the catalyst face is less than 10% at a load condition on the combustor of 80% to 100% of the full load combustor capacity.

3. The method of claim 1, wherein the injector is a solenoid pulse width reagent injector used without air assistance.

4. The method of claim 1, wherein the injector is used with air assistance for atomization to produce a droplet of less than 50 microns Sauter mean diameter.

5. The method of claim 1, wherein the reagent is urea.

6. The method of claim 1, wherein the reagent is ammonia.

7. The method of claim 1, wherein uncontrolled NOx emissions of the combustor are less than 100 ppm.

8. The method of claim 1, wherein the injection rate of the at least one reagent injector is less than 60 gph.

9. The method of claim 1, wherein the flow conditioning device comprises at least one of the following: a perforated plate, a turning vane, a baffle, and a swirler.

10. The method of claim 9, wherein the flow conditioning device is located in the exhaust system upstream of a first injection point of the reagent.

11. The method of claim 9, wherein the flow conditioning device is located in the exhaust system downstream of a first injection point of the reagent but upstream of the face catalyst of the catalyst.

12. A method for reducing NOx emissions from a lean burn combustor equipped with a NOx reducing exhaust catalyst, said method comprising the steps of:
   generating a computer based model of the geometry of an exhaust system of the combustor;
   computing at least one of flue gas velocity profiles and mass flow stream lines for exhaust gas flow through the exhaust system;
   inputting injector data comprising at least droplet size and velocity;
   modeling droplet trajectories for a plurality of injector locations;
   modeling at least one flow conditioning device in the exhaust system; and
   manipulating the computer based model until an injector location is identified that provides a predicted root mean square (RMS) of reagent at a face of the catalyst that is less than 15%.

13. The method of claim 12, further comprising the step of injecting an aqueous based reagent into the exhaust system in a location identified in said integrating step.

14. The method of claim 12, wherein the predicted root mean square (RMS) at the catalyst face is less than 10% at a load condition on the combustor of 80% to 100% of the full load combustor capacity.

15. The method of claim 13, wherein the reagent is injected by a solenoid pulse width reagent injector used without air assistance.

16. The method of claim 13, wherein the reagent is injected by an injector used with air assistance for atomization to produce a droplet of less than 50 microns average diameter.

17. The method of claim 13, wherein the reagent is urea.

18. The method of claim 13, wherein the reagent is ammonia.

19. The method of claim 13, wherein the injection rate of the reagent is less than 60 gph.

20. The method of claim 12, wherein the flow conditioning device comprises at least one of the following: a perforated plate, a turning vane, a baffle, and a swirler.

21. The method of claim 20, wherein the flow conditioning device is located in the exhaust system upstream of a first injection point of the reagent.

22. The method of claim 20, wherein the flow conditioning device is located in the exhaust system downstream of a first injection point of the reagent but upstream of the face catalyst of the catalyst.

* * * * *